United States Patent
Kikugawa et al.

(10) Patent No.: US 8,948,417 B2
(45) Date of Patent: Feb. 3, 2015

(54) CHARACTERISTIC CORRECTING DEVICE AND CHARACTERISTIC CORRECTING METHOD

(75) Inventors: Yusaku Kikugawa, Ome (JP); Takashi Sudo, Fuchu (JP); Masataka Osada, Kawasaki (JP); Takehiko Isaka, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 425 days.

(21) Appl. No.: 13/399,917

(22) Filed: Feb. 17, 2012

(65) Prior Publication Data

US 2012/0250886 A1 Oct. 4, 2012

(30) Foreign Application Priority Data

Mar. 31, 2011 (JP) .................................. 2011-079815

(51) Int. Cl.
*H03G 9/00* (2006.01)
*H03G 5/00* (2006.01)
*H03G 5/16* (2006.01)

(52) U.S. Cl.
CPC ............... *H03G 5/165* (2013.01); *H03G 5/005* (2013.01)
USPC .............. 381/102; 381/98; 381/101; 381/103

(58) Field of Classification Search
USPC ......... 381/102, 103, 100, 101, 98, 96, 56, 58, 381/59, 94.1, 94.8, 94.4
See application file for complete search history.

(56) References Cited

U.S. PATENT DOCUMENTS

| | | | |
|---|---|---|---|
| 6,360,199 B1 | 3/2002 | Yokoyama | |
| 7,664,276 B2 * | 2/2010 | McKee Cooper | 381/103 |
| 8,045,721 B2 * | 10/2011 | Burgan et al. | 381/57 |
| 8,045,731 B2 | 10/2011 | Aoki et al. | |
| 8,121,312 B2 * | 2/2012 | Horbach et al. | 381/99 |
| 8,509,456 B2 * | 8/2013 | Yamada | 381/102 |
| 2006/0251261 A1 | 11/2006 | Christoph | |
| 2009/0274307 A1 * | 11/2009 | Yoshino et al. | 381/1 |
| 2010/0239097 A1 * | 9/2010 | Trautmann et al. | 381/56 |

FOREIGN PATENT DOCUMENTS

| | | |
|---|---|---|
| JP | 06-334457 A | 12/1994 |
| JP | 10-178695 A | 6/1998 |

(Continued)

OTHER PUBLICATIONS

Decision to Grant a Patent mailed by Japanese Patent Office on Jun. 5, 2012 in the corresponding Japanese Patent Application No. 2011-079815—4 pages.

*Primary Examiner* — Vivian Chin
*Assistant Examiner* — David Ton
(74) *Attorney, Agent, or Firm* — Knobbe, Martens, Olson & Bear LLP

(57) ABSTRACT

According to one embodiment, a characteristic correcting device includes: a correction filter configured to correct sound quality characteristics of a plurality of bands in a frequency range of an input signal based on a frequency characteristic which is set in advance to generate an output signal; an input module configured to input a surrounding sound signal of sound around an output device outputting the output signal; and an adjusting module configured to reduce the number of the bands of which the sound quality characteristics are to be corrected of the bands in the frequency range of the input signal in accordance with an increase in amplitude of the surrounding sound signal which is input.

3 Claims, 4 Drawing Sheets

(56) References Cited

FOREIGN PATENT DOCUMENTS

| | | | |
|---|---|---|---|
| JP | 10-341123 | A | 12/1998 |
| JP | 2000-010591 | A | 1/2000 |
| JP | 2000-114899 | A | 4/2000 |
| JP | 2006-314080 | A | 11/2006 |
| JP | 2006-340328 | A | 12/2006 |
| JP | 2008-209768 | A | 9/2008 |
| JP | 2008-227606 | A | 9/2008 |
| JP | 2008-227608 | A | 9/2008 |

\* cited by examiner

CHARACTERISTIC CORRECTING DEVICE AND CHARACTERISTIC CORRECTING METHOD

CROSS-REFERENCE TO RELATED APPLICATIONS

This application is based upon and claims the benefit of priority from Japanese Patent Application No. 2011-079815, filed Mar. 31, 2011, the entire contents of which are incorporated herein by reference.

FIELD

Embodiments described herein relate generally to a characteristic correcting device and a characteristic correcting method.

BACKGROUND

Equalizers or similar devices have been used for adjusting sound quality of digital audio signals. Equalizers adjust the frequency characteristic of input audio signals. Specifically, equalizers achieve desired sound quality adjustment by emphasizing or suppressing a specific frequency range of input audio signals. The audio signals output from the equalizers are converted into analog signals by digital-analog (D/A) converters and are provided to analog signal processors including output devices (such as speakers, headphones, earphones, and receivers for conversation).

When equalizers emphasize a specific frequency range of audio signals, clipping occur in which the amplitude level of audio signals output from the equalizers exceed the maximum amplitude level capable of being operated by D/A converters. Hearers are prone to sense the deterioration of sound quality at the clipping occurring portion.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

In general, according to one embodiment, a characteristic correcting device comprises a correction filter, an input module, and an adjusting module. The correction filter is configured to correct sound quality characteristics of a plurality of bands in a frequency range of an input signal based on a frequency characteristic which is set in advance to generate an output signal. The input module is configured to input a surrounding sound signal of sound around an output device outputting the output signal. The adjusting module is configured to reduce the number of the bands of which the sound quality characteristics are to be corrected of the bands in the frequency range of the input signal in accordance with an increase in amplitude of the surrounding sound signal which is input.

A characteristic correcting device and a characteristic correcting method according to an embodiment will now be explained in detail with reference to the drawings.

Figure 1:
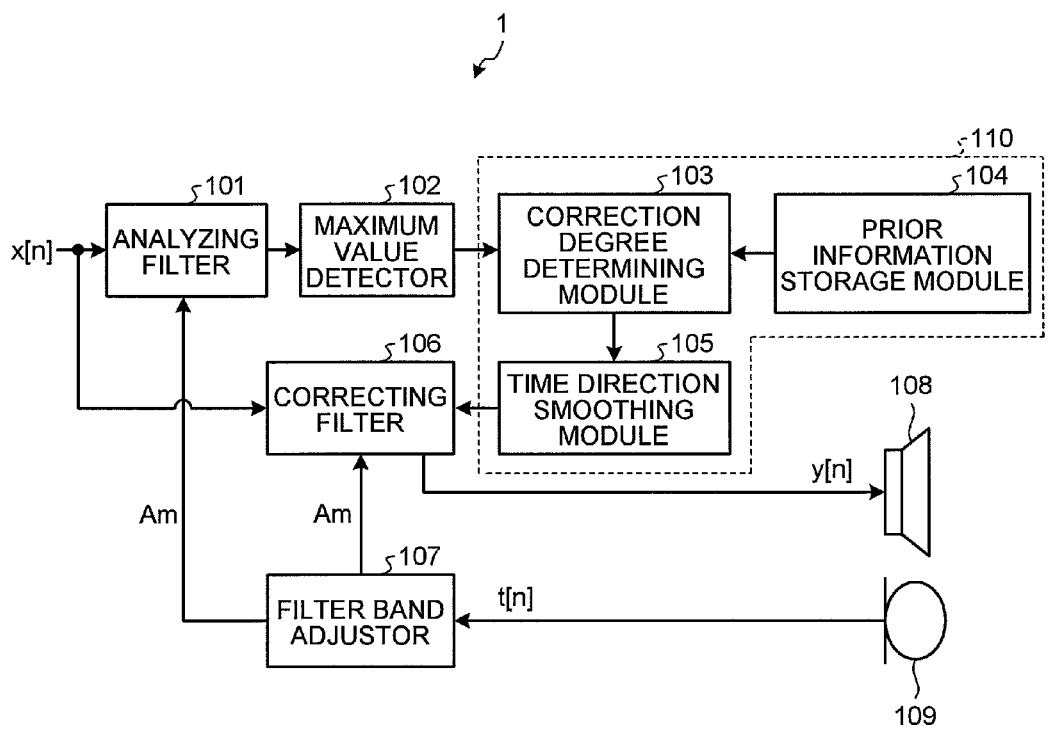
FIG. 1 is an exemplary block diagram of a structure of a characteristic correcting device according to an embodiment.

FIG. 1 is a block diagram of a structure of a characteristic correcting device according to an embodiment. A characteristic correcting device 1 in the present embodiment comprises an analyzing filter 101, a maximum value detector 102, an equalizer (EQ) index adjuster 110, a correction filter 106, a filter band adjustor 107, a speaker 108, and a microphone 109. In the characteristic correcting device 1, an EQ coefficient set to be assigned to an input audio signal x[n] (input signal) is derived or calculated by the analyzing filter 101, the maximum value detector 102, and the EQ index adjuster 110. The correction filter 106 applies the assigned EQ coefficient set to the audio signal x[n] to generate an audio signal y[n] (output signal) to be output to the speaker 108. In the characteristic correcting device 1, an example is described in which the EQ coefficient set is applied to the audio signal x[n] to generate the audio signal y[n], but it is not limited to the audio signal x[n]. That is, an output signal can also be generated by applying the EQ coefficient set to an input signal such as sound except for the audio signal x[n].

The characteristic correcting device 1 is typically incorporated in, for example, equipment having audio output function, such as cellular phones, personal computers, and audio equipment. For example, the characteristic correcting device 1 is mounted on a digital signal processor (DSP) inside a cellular phone.

The audio signal x[n] is generated by, for example, decoding, by a decoder (not illustrated), verbal communication data received by a communicating module (not illustrated). The audio signal x[n] may also be generated by decoding, by a decoder (not illustrated), content data such as music and video that is stored (including temporarily stored) in a storage module (such as a hard disk, a flash memory, a removal medium, and a buffer) (not illustrated). Moreover, the audio signal x[n] may also be generated by decoding, by a decoder (not illustrated), broadcast wave (such as television (TV) broadcast wave and radio broadcast wave) data received by a communicating module (not illustrated). The audio signal x[n] is processed in a frame unit of T pieces of samples (that is, x[1], x[2], and so on, x[T]).

The analyzing filter 101 performs equalization processing on the audio signal x[n] based on a reference frequency characteristic provided using a preset EQ coefficient (filter coefficient) set. The equalization processing herein includes correcting a sound quality characteristic by emphasizing or suppressing a band of the number Am of the bands which is set in advance of a plurality of bands in the frequency range of the audio signal x[n]. The analyzing filter 101 may be generated using a finite impulse response (FIR) filter, a fast Fourier transform (FFT) filter, or other filters but is generated using an infinite impulse response (IIR) filter with a small processing amount in the following descriptions.

The EQ coefficient set used by the analyzing filter 101 may be set by a user or may also be automatically set by a component (not illustrated). As an example, an output device (for example, the speaker 108 comprised in the characteristic correcting device 1) outputs a reference sound signal (for example, white noise), and the signal is collected by a recording microphone or similar devices to derive or calculate the inverse characteristic of the frequency characteristic of the collected audio signal. The EQ coefficient set can be set in advance based on the inverse characteristic. The EQ coefficient set which is thus set is effective for sound quality improvement of the output device. The analyzing filter 101 outputs the equalized audio signal x[n] (audio signal to be analyzed) to the maximum value detector 102.

The maximum value detector 102 detects the value which is maximum (amplitude) in a frame of the equalized audio signal x[n] as the feature value (for example, amplitude level) of the audio signal x[n]. The maximum value detector 102 may also detect a feature value such as the amplitude average value, amplitude dispersion, and the number of zero crossing of the audio signal x[n] instead of the intra-frame maximum value. A plurality of feature values may also be detected in order to improve correlation with the regression analysis result of the presence or absence of clipping occurrence to be described later.

The EQ index adjuster 110 adjusts an EQ index to be assigned to the audio signal x[n] based on the feature value (amplitude level) of the audio signal x[n] detected by the maximum value detector 102. The EQ index determines a frequency characteristic of equalization processing performed by the correction filter 106 as exemplified in a formula (1):

$$adjustEQ[w] = \frac{eq\_idx}{S} \times userEQ[w]. \quad (1)$$

In the formula (1), eq_idx is an EQ index (an integer value of equal to or larger than 1 and equal to or smaller than S), and userEQ[W] is a reference frequency characteristic (gain value) of the frequency bin number w in the equalization processing performed by the correction filter 106. In other words, by the formula (1), the reference frequency characteristic userEQ[W] is scaled based on the assigned EQ index value eq_idx.

Figure 2:
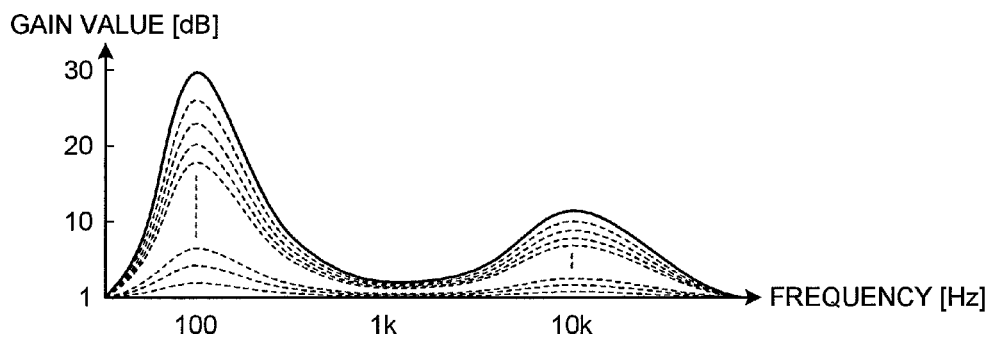
FIG. 2 is an exemplary graph for illustrating an example of an application of an equalizer (EQ) index in the embodiment.

FIG. 2 is a graph for illustrating an example of the application of the EQ index. In FIG. 2, the solid line indicates the reference frequency characteristic userEQ[W] (same as the adjusted frequency characteristic adjustEQ[W] when the EQ index eq_idx is S), and the broken lines indicate the adjusted frequency characteristic adjustEQ[W] when the EQ index eq_idx is equal to or less than (S−1).

The EQ index is also applicable by a method different from the formula (1). Specifically, the upper limit of the adjusted frequency characteristic adjustEQ[W] can be scaled (saturated) depending on the EQ index value eq_idx. In this case, the adjusted frequency characteristic adjustEQ[W] is identical to the reference frequency characteristic userEQ[W] unless exceeding the upper limit depending on the EQ index eq_idx.

Figure 3:
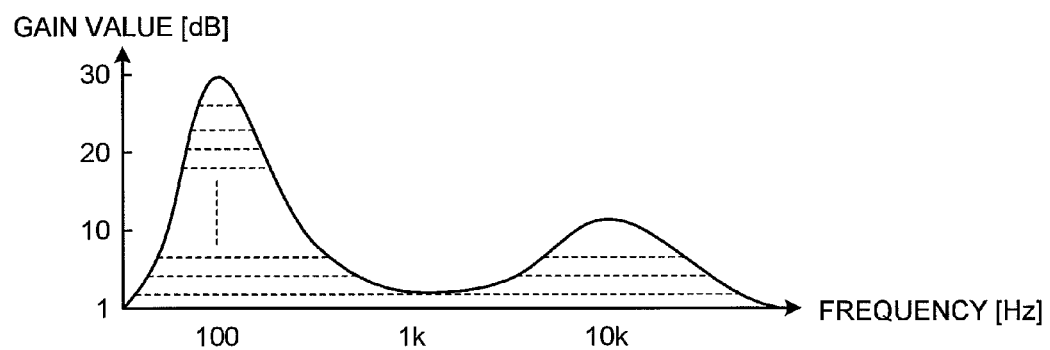
FIG. 3 is an exemplary graph for illustrating another example of an application of the EQ index in the embodiment.

FIG. 3 is a graph for illustrating another example of the application of an EQ index. In FIG. 3, the solid line indicates the reference frequency characteristic userEQ[W] (same as the adjusted frequency characteristic adjustEQ[W] when the EQ index value eq_idx is S), and the broken lines indicate the adjusted frequency characteristic adjustEQ[W] when the EQ index value eq_idx value is equal to or less than (S−1). The reference frequency characteristic userEQ[W] is generally made to be identical to the frequency characteristic of the equalization processing performed by the analyzing filter 101. However, the two frequency characteristics can also be differently designed from each other.

The EQ index adjuster 110 specifically comprises a correction degree determining module 103, a prior information storage module 104, and a time direction smoothing module 105.

The prior information storage module 104 stores therein a result of the regression analysis indicating the presence or absence of clipping occurrence when each of a plurality of frequency characteristics (comprising a reference frequency characteristic and at least one adjusted frequency characteristic) is set relative to a feature value (amplitude level) for prior learning.

The correction degree determining module 103 calculates an EQ index based on the regression analysis result stored in the prior information storage module 104 and the feature value (amplitude level) of the audio signal x[n] detected by the maximum value detector 102 and sets a frequency characteristic provided using an EQ coefficient set corresponding to the calculated EQ index to one frame of the audio signal x[n]. Specifically, the correction degree determining module 103 calculates an EQ index value eq_idx by a formula (2) below utilizing a coefficient α obtained from the regression analysis result:

$$eq\_idx = S - (\alpha \times m\_lev) \quad (2).$$

The coefficient α is obtained by performing regression analysis of the presence or absence of clipping occurrence with respect to the feature values of a plurality of audio signals x[n] for prior learning when various EQ indexes eq_idx are given. Theoretically, the formula (2) calculates the largest EQ index with which clipping occurrence is prevented while being applied to the audio signal x[n]. Naturally, an EQ coefficient set eq_coef[t] can also be calculated without using the EQ index. For example, when the right-hand side of the formula (2) is substituted for the EQ index eq_idx in the formula (1), the adjusted frequency characteristic adjustEQ[W] can be derived or calculated. In a method of utilizing the EQ index as a medium, the corresponding EQ coefficient set can be prepared in advance, which is advantageous in computation cost reduction. To simplify the description, in the present embodiment, an example in which the EQ coefficient set eq_coef[t] is calculated using the EQ index as a medium is described. Proper EQ indexes can be calculated with a small processing amount (that is, with low delay) by utilizing the coefficient α obtained from the prior learning in such a manner.

The presence or absence of clipping occurrence also depends on the type of the output device outputting the audio signal x[n]. Therefore, when the EQ index eq_idx is calculated, it is desirable to correct the EQ index eq_idx based on the type of the output device. Specifically, the correction degree determining module 103 can calculate the EQ index with which various types of output devices can stably avoid clipping occurrence by using a formula (3) in stead of the formula (2):

$$eq\_idx = \{S - (\alpha \times m\_lev)\} \times \beta(device) \quad (3).$$

In the formula (3), β(device) is a correction coefficient corresponding to the type of the output device. Here, device is a variable indicating the type of the output device, and as an example, when the type of the output device is the speaker 108, device=0 is satisfied, and when the type of the output device is an earphone, device=1 is satisfied. Typically, the speaker 108 tends to cause clipping as compared with the earphone. Therefore, when the correction coefficient β(device) is set so as to satisfy 1>β(1)>β(0), the output device can be switched between the speaker 108 and the earphone to stably avoid clipping occurrence using a single coefficient α.

The presence or absence of clipping occurrence depends on elements different from the type of the output device. Therefore, for example, when the correction filter 106 is an equalizer, it is also effective to use a correction coefficient γ (eq_freq) depending on a resonance frequency eq_freq as indicated in a formula (4):

$$\text{eq\_idx} = \{S - (\alpha \times m\_lev)\} \times \gamma(\text{eq\_freq}) \quad (4).$$

The presence or absence of clipping occurrence also depends on the type (such as POPS and ROCK) of the equalizer set by a user or the like. Accordingly, it is also effective to use a correction coefficient according to the type of the equalizer.

In practice, the EQ index eq_idx is an integer value, and thus, the right-hand sides of the formulae (2), (3), and (4) can be rounded (for example, rounded off or rounded up) to integer values.

Figure 4:
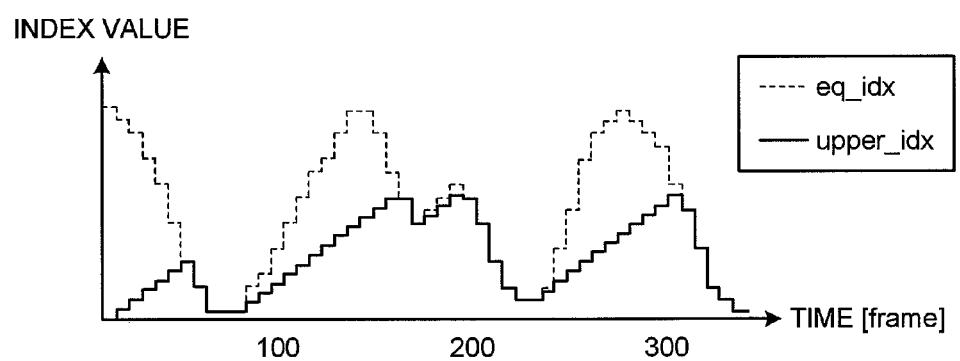
FIG. 4 is an exemplary graph exemplifying an operation of a time direction smoothing module in the embodiment.

The time direction smoothing module 105 sets the upper limit of the EQ index eq_idx assigned to the current frame based on a processed EQ index pre_upper_idx with respect to the immediately preceding frame. FIG. 4 is a graph exemplifying the operation of the time direction smoothing module. For example, as illustrated in FIG. 4, in the time direction smoothing module 105, when the current EQ index eq_idx is increased by a predetermined value or more as compared with the immediately preceding processed EQ index pre_upper_idx, a value obtained by adding the immediately preceding processed EQ index pre_upper_idx to the predetermined value is determined as a current processed EQ index upper_idx.

As a result, abrupt increase of the EQ index can be suppressed between the adjacent frames, and thus, a hearer rarely senses unnatural sound quality change. On the other hand, lower processing for setting a lower limit to the current EQ index eq_idx is not performed. If lower processing is performed, the current EQ index does not sufficiently decrease, and thus, clipping is expected to occur in the current frame. It is also not desirable to set the predetermined value described above to an excessively small value in terms of achieving smooth sound quality adjustment. As an example, the predetermined value can be set so that the increase in the gain value of about 1 dB per 1 second is set as the upper limit, but can also be set to different values from this.

The time direction smoothing module 105 also smoothes the change from the immediately preceding processed EQ index pre_upper_idx to the current processed EQ index upper_idx in a sample unit in the current frame.

Specifically, the time direction smoothing module 105 assigns a smoothing EQ index smth_idx[t] in a sample unit in the current frame by a formula (5):

$$\text{smth\_idx}[t] = \begin{cases} \text{smth\_idx}[t-1] + 1, & \text{if } (\text{smth\_idx}[t-1] < \text{upper\_idx}) \\ \text{smth\_idx}[t-1] - 1, & \text{if } (\text{smth\_idx}[t-1] > \text{upper\_idx}) \\ \text{smth\_idx}[t-1], & \text{if } (\text{smth\_idx}[t-1] = \text{upper\_idx}). \end{cases} \quad (5)$$

In the formula (5), to calculate the smoothing EQ index smth_idx[1], smth_idx[0]=pre_upper_idx may be satisfied.

Figure 5:
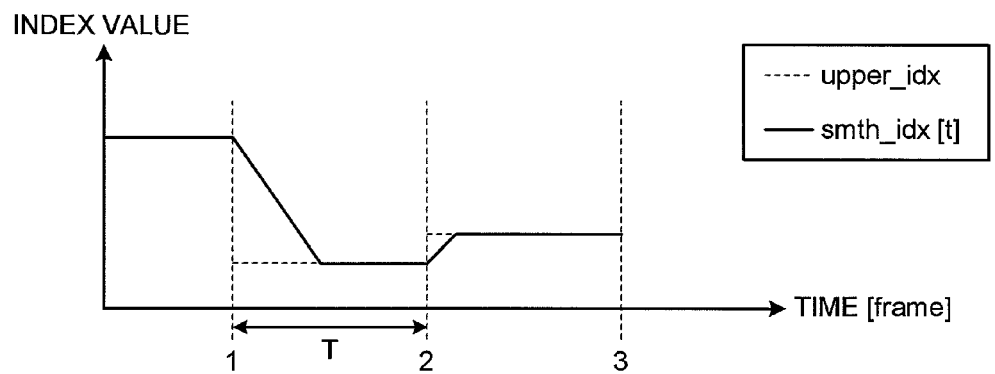
FIG. 5 is an exemplary graph exemplifying another operation of the time direction smoothing module in the embodiment.

Accordingly, the EQ index can be avoided from abruptly increasing or decreasing at the boundary between the adjacent frames (that is, between the first sample of the current frame and the last sample of the immediately preceding frame). FIG. 5 is a graph exemplifying another operation of the time direction smoothing module. As illustrated in FIG. 5, the smoothing EQ index smth_idx[t] is smoothed so as to gradually (for example, one by one) increase or decrease from pre_upper_idx to converge to upper_idx in the current frame. The maximum value of difference between the immediately preceding processed EQ index pre_upper_idx and the current processed EQ index upper_idx is (S−1) (pre_upper_idx=S and upper_idx=1). The number of samples in the frame is T. Therefore, when T×1≥S−1 is satisfied, the smoothing EQ index smth_idx[t] reliably converges to upper_idx in the current frame. When the time direction smoothing module 105 employs step sizes except for "1", T or S may be set according to the size.

The correction filter 106 reads out the EQ coefficient set eq_coef[t] corresponding to the smoothing EQ index smth_idx[t] for each sample of the current frame from an EQ coefficient storage module (not illustrated). Subsequently, the correction filter 106 performs equalization processing on the corresponding audio signal x[n] based on a frequency characteristic provided using the read EQ coefficient set eq_coef[t] to generate the audio signal y[n] (output audio signal) to be output. In the equalization processing herein, sound quality characteristics are corrected by emphasizing or suppressing the bands of the number Am of the bands that is set in advance by the filter band adjustor 107 (to be described later) of a plurality of bands in the frequency range of the audio signal x[n] based on the frequency characteristic provided using the read EQ coefficient set. The equalization processing may be implemented using an FIR filter, an FFT filter, or other filters but is implemented using an IIR filter with a small processing amount in the following descriptions. The audio signal y[n] is supplied to a digital/analog (D/A) converter (not illustrated) to be converted from digital to analog and is output from the speaker 108 to be sensed by a hearer.

The microphone 109 is an input module that collects surrounding noise around the speaker 108 as the output device outputting the audio signal y[n] to input an audio signal t[n] (surrounding sound signal) of the collected surrounding noise around the speaker 108 to the inside the characteristic correcting device 1. In the present embodiment, an example of the microphone 109 that inputs the audio signal t[n] of the surrounding noise around the speaker 108 in the inside the characteristic correcting device 1 is described. However, it is not limited to the surrounding noise around the speaker 108 and a microphone may be employed so long as the microphone inputs the surrounding sound signal of surrounding sound around the speaker 108.

The filter band adjustor 107 reduces the number Am of the bands to be output to the analyzing filter 101 and the correction filter 106 in accordance with the increase in the amplitude level of the audio signal t[n] input by the microphone 109. When a FIR filter, a FFT filter, or a similar filter is employed as the analyzing filter 101 or the correction filter 106, the filter band adjustor 107 can replace the number of the bands by the number of the taps of the FIR filter, the number of the bandwidth bins of the FFT filter, and other numbers.

Figure 6:
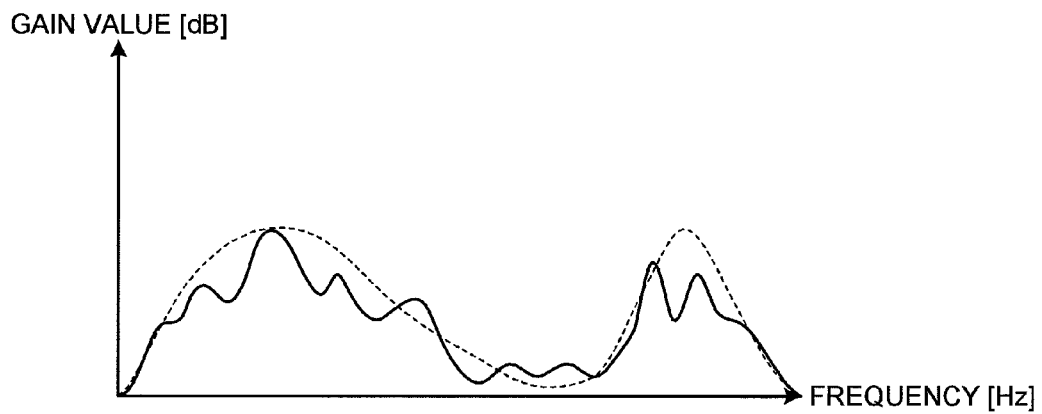
FIG. 6 is an exemplary graph illustrating a frequency characteristic of an analyzing filter and a correction filter in the embodiment.

FIG. 6 is a graph illustrating a frequency characteristic of the analyzing filter and the correction filter. In FIG. 6, the solid line indicates the frequency characteristic of the analyzing filter 101 and the correction filter 106 when the number Am of the bands to be equalized of a plurality of bands in the frequency range of the audio signal x[n] is not reduced. In FIG. 6, the broken line indicates the frequency characteristic of the analyzing filter 101 and the correction filter 106 when the number Am of the bands to be equalized of a plurality of bands in the frequency range of the audio signal x[n] is reduced. The filter band adjustor 107 reduces the number Am of the bands to be equalized by the analyzing filter 101 and the correction filter 106 of a plurality of bands in the frequency range of the audio signal x[n], and thus, the frequency characteristic of the analyzing filter 101 and the correction filter 106 is changed as illustrated in FIG. 6. However, when the surrounding noise around the speaker 108 is large, a user rarely senses the sound quality change of the audio signal y[n] output from the speaker 108, and therefore, the number Am of the bands can be reduced within the scope of not being influenced.

The filter band adjustor 107 may also reduce the number Am of the bands of which the sound quality characteristics are to be corrected of a plurality of bands in the frequency range of the audio signal x[n] except the neighborhood of the resonance frequency of the speaker 108 in accordance with the increase in the amplitude level of the audio signal t[n] input by the microphone 109.

Figure 7:
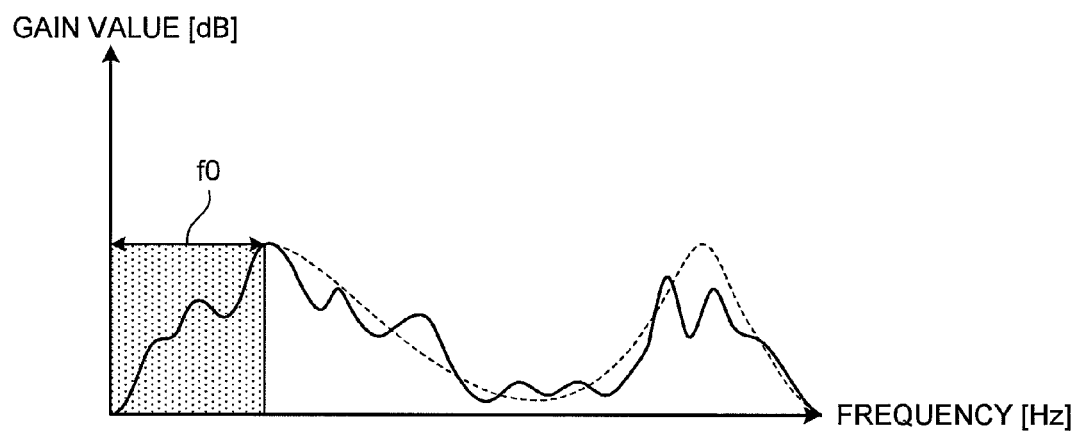
FIG. 7 is an exemplary graph illustrating the frequency characteristic of the analyzing filter and the correction filter and a neighborhood of a resonance frequency of an output device in the embodiment.

FIG. 7 is a graph illustrating the frequency characteristic of the analyzing filter and the correction filter. In FIG. 7, the solid line indicates the frequency characteristic of the analyzing filter 101 and the correction filter 106 when the number Am of the bands of which the sound quality characteristics are to be corrected of a plurality of bands in the frequency range of the audio signal is not reduced. In FIG. 7, the broken line indicates the frequency characteristic of the analyzing filter 101 and the correction filter 106 when the number Am of the bands of which the sound quality characteristics are to be corrected of a plurality of bands in the frequency range of the audio signal is reduced. The filter band adjustor 107 reduces only the number Am of the bands except the neighborhood f0 of the resonance frequency of the speaker 108 in the frequency range of the audio signal x[n]. Thus, equalization processing is correctly performed on the band in the neighborhood f0 of the resonance frequency at which influence by the equalization processing performed by the analyzing filter 101 and the correction filter 106 is easily sensed, and equalization processing can be simplified for the other band. Therefore, a calculating amount can be reduced without causing sound quality deterioration due to clipping.

As described above, the characteristic correcting device 1 of the present embodiment comprises: the analyzing filter 101 configured to correct sound quality characteristics of the bands of the number Am of the bands which is set in advance of a plurality of bands in the frequency range of the audio signal x[n] based on the reference frequency characteristic; the maximum value detector 102 configured to detect the feature value of the audio signal x[n] of which the sound quality characteristic is corrected; the setting module configured to set one frequency characteristic with which no clipping occurs relative to the feature values of the audio signal x[n] based on the result of the regression analysis indicating the presence or absence of clipping occurrence when each of a plurality of frequency characteristics is set relative to a feature value for prior learning and the feature value of the detected audio signal x[n]; the correction filter 106 configured to correct the sound quality characteristics of the bands of the number Am of the bands which is set in advance of a plurality of bands in the frequency range of the audio signal x[n] based on the set frequency characteristic; and the adjusting module configured to reduce the number Am of the bands of which the sound quality characteristics are to be corrected with the correction filter 106 of a plurality of bands in the frequency range of the audio signal x[n] in accordance with the increase in the amplitude level of the audio signal t[n] around the speaker 108 outputting the audio signal y[n] of which the sound quality characteristics are corrected. With such a structure, the number Am of the bands can be reduced within the scope of not being influenced under an environment where the surrounding noise around the speaker 108 is too large for a user to sense the sound quality change. Therefore, even when the calculating amount of processing for correcting sound quality characteristics is reduced, sound quality can be stably adjusted while a user does not sense the sound quality deterioration due to clipping.

The computer program implemented by the characteristic correcting device 1 of the present embodiment is provided while being previously incorporated in a read-only memory (ROM) or the like.

The computer program implemented by the characteristic correcting device 1 of the present embodiment may be provided by being recorded in a recording medium readable by a computer, such as a compact disk read only memory (CD-ROM), a flexible disk (FD), a CD recordable (CD-R), and digital versatile disk (DVD) that are in an installable format or in an executable format.

The computer program implemented by the characteristic correcting device 1 of the present embodiment may also be provided by storing it in a computer connected to a network such as the Internet and downloading it through the network. The computer program implemented by the characteristic correcting device 1 of the present embodiment may also be provided or distributed through a network such as the Internet.

The computer program implemented by the characteristic correcting device 1 of the present embodiment has a module structure comprising each module described above (the analyzing filter 101, the maximum value detector 102, the correction filter 106, the filter band adjustor 107, the EQ index adjuster 110, or other modules). As actual hardware, a central processing unit (CPU) (processor) reads out the computer program from the ROM and implements it to load each module described above on a main storage module to generate the analyzing filter 101, the maximum value detector 102, the correction filter 106, the filter band adjustor 107, the EQ index adjuster 110, and other modules on the main storage module.

Moreover, the various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A characteristic correcting device comprising:
    a filter to correct sound quality characteristics of a plurality of bands in a frequency range of an input signal based on a frequency characteristic which is set in advance to generate an output signal;
    an input terminal to receive a surrounding sound signal of sound around an output device outputting the output signal; and a processing circuitry to reduce the number of the bands of which the sound quality characteristics are to be corrected of the bands in the frequency range of the input signal in accordance with an increase in amplitude of the surrounding sound signal which is input, and to reduce the number of the bands of which the sound quality characteristics are to be corrected of the bands in the frequency range of the input signal except a neighborhood of a resonance frequency of the output device.

2. The characteristic correcting device of claim 1, comprising:

the filter to correct sound quality characteristics of the bands in the frequency range of the input signal based on a reference frequency characteristic to generate an analyzing signal;

a detector to detect a feature value of the generated analyzing signal; and a setting module to set a frequency characteristic with which no clipping occurs to the input signal based on a result of a regression analysis indicating presence or absence of clipping occurrence when each of a plurality of frequency characteristics is set relative to a feature value for prior learning and the detected feature value, the filter to correct the sound quality characteristics of the bands in the frequency range of the input signal based on the frequency characteristic set by the setting module, and the adjusting module to reduce the number of the bands of which the sound quality characteristics are to be corrected of the bands in the frequency range of the input signal with the analyzing filter in accordance with the increase in amplitude of the surrounding sound signal input by the input module.

3. A characteristic correcting method comprising:

correcting, by a correction filter, sound quality characteristics of a plurality of bands in a frequency range of an input signal based on a frequency characteristic which is set in advance to generate an output signal;

inputting, by an input module, a surrounding sound signal of sound around an output device outputting the output signal; and reducing, by an adjusting module, the number of the bands of which the sound quality characteristics are to be corrected of the bands in the frequency range of the input signal in accordance with an increase in amplitude of the surrounding sound signal which is input, wherein the reducing includes reducing the number of the bands of which the sound quality characteristics are to be corrected of the bands in the frequency range of the input signal except a neighborhood of a resonance frequency of the output device.

* * * * *